(12) United States Patent
Ohashi et al.

(10) Patent No.: US 6,352,153 B1
(45) Date of Patent: Mar. 5, 2002

(54) SOLDER BALL CONTAINER

(75) Inventors: Fumio Ohashi, Mohka; Takashi Hori, Utsunomiya; Michio Iguchi, Mohka; Hiroshi Akutsu, Mohka; Takashi Narita, Mohka; Takeshi Nikaido, Kasukabe, all of (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 09/532,443

(22) Filed: Mar. 23, 2000

(30) Foreign Application Priority Data

Mar. 24, 1999 (JP) ............................. 11-078788

(51) Int. Cl.$^7$ .................. B65D 81/02; B65D 85/58
(52) U.S. Cl. .................. 206/205; 53/420; 206/540; 206/814
(58) Field of Search ................. 206/722, 723, 206/540, 526, 804, 205, 814; 215/231; 53/410, 420, 471

(56) References Cited

U.S. PATENT DOCUMENTS 2,884,149 A * 4/1959 Zimmermann et al. ..... 215/231
3,580,409 A * 5/1971 Soboleski .................... 215/231
3,998,349 A * 12/1976 Megowen .................... 215/231
5,096,078 A * 3/1992 McQueeny .................. 215/231

FOREIGN PATENT DOCUMENTS

| DE | 1696096 | 4/1955 |
| DE | 1709810 | 11/1955 |
| DE | 1176793 | 8/1964 |
| FR | 1261213 | 9/1961 |
| FR | 2070789 | 9/1971 |

* cited by examiner

Primary Examiner—Jim Foster
(74) Attorney, Agent, or Firm—Michael Tobias (57) ABSTRACT

A cylindrical container with a bottom has an opening in which a projection is installed, the projection having a shape which will not deform solder balls when inserted into a packed layer of solder balls within the container. Its shape is such that its cross section has a streamlined or inverted conical shape, or it is cylindrical with a tip having a semi-spherical or inverted conical shape. Blackening, electrical charging, and deformation of solder balls packed in the container can be prevented during transport.

21 Claims, 7 Drawing Sheets

SOLDER BALL CONTAINER

BACKGROUND OF THE INVENTION

This invention relates to a container for housing a large number of minute solder balls.

Multifunctional electronic components such as BGA's, CSP's, and the like are mounted on printed circuit boards by joining the leads to the lands of printed circuit boards with solder. Multifunctional electronic components have a large number of leads, and the leads are extremely small, so when solder is separately supplied at the time of soldering, not only is a great deal of labor required, but is not possible to accurately supply solder to minute portions to be soldered. Therefore, with multifunctional electronic components, solder is adhered to the leads in advance to form solder bumps, and at the time of soldering, the bumps are melted to perform soldering. Solder balls are used to form solder bumps for such multifunctional electronic components.

In general, with solder balls used for BGA's, those having a diameter of 0.76 mm are most common, but with CSP's, minute ones having a diameter such as 0.15 mm or 0.1 mm are used. These solder balls are placed in containers made of glass or plastic and are transported from the manufacturer to the consumer.

A method of forming solder bumps for multifunctional electronic components comprises coating the leads in the locations which are to soldered with a sticky flux, mounting solder balls on the regions which have been coated with flux using a mounting device and then performing heating with a heating device such as a reflow furnace, and then melting the solder balls to form solder bumps.

However, when forming solder bumps on multifunctional electronic components, problems occur such as inadequate adhesion in which the solder balls do not thoroughly adhere to the leads, or the region in the vicinity of where solder bumps are formed becoming dirty. As other problems, there were cases where failure of mounting took place in which solder balls could not be mounted at all on the portions of multifunctional electronic components where solder bumps were to be formed, or where over-mounting occurred in which a plurality of solder balls were mounted.

The present inventors performed an intensive study of the above-described problems, and as a result, it was found that the occurrence of inadequate adhesive strength or of the vicinity of the region where solder bumps are formed becoming dirty is due to the surface of solder balls becoming covered with black powder and becoming blackened, and the failure of mounting to take place or over-mounting of solder balls in the region where solder bumps are to be formed is due to solder balls becoming charged with static electricity.

Namely, when the surface of solder balls becomes blackened, the black powder becomes a hindrance to soldering at the time of soldering, and the solder balls do not completely adhere to leads, and even if solder balls which have become blackened adhere to leads, black powder which falls from the solder balls remains in the vicinity of the regions where bumps are to be formed and ends up making the regions dirty. In addition, if this black powder adheres to the regions between leads having a narrow pitch, poor insulation can result.

Furthermore, if solder balls become charged, there are cases in which due to static electricity, failure of mounting takes place, and they adhere to unnecessary locations. Solder balls are not mounted on the prescribed locations of an electronic device. In addition, if a plurality of solder balls end up adhering due to static electricity to a prescribed portion of a solder ball mounting jig, excessive mounting occurs, and a giant bump ends up being formed at the time of solder bump formation.

Figure 1:
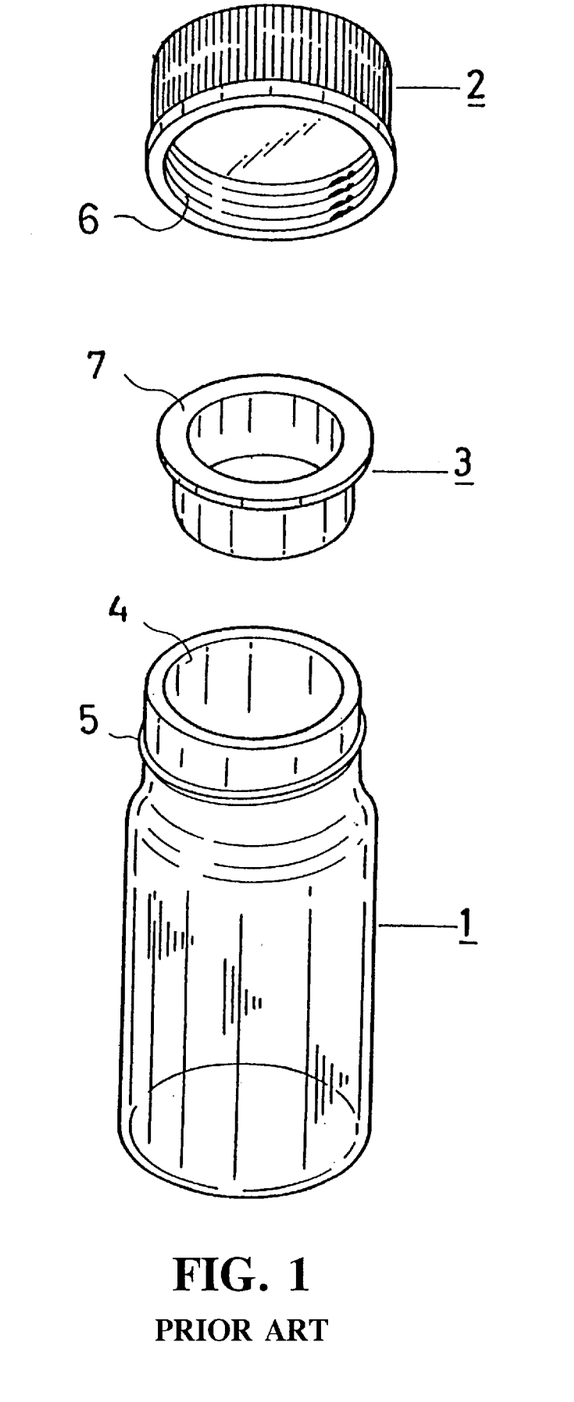
FIG. 1 is an exploded perspective view of an existing solder ball container.

As shown in FIG. 1, an existing solder ball container (referred to below as a container) was made up of a body 1, an outer lid 2, and a middle lid 3. The body 1 was a cylindrical member with a bottom and was made of a transparent material such as glass or plastic, an opening 4 was formed in its upper portion, and a male thread 5 was formed on the outside of the upper portion.

The outer lid 2 is in the shape of a cap, and a female thread 6 which engages with the male thread 5 of the body 1 is formed on its interior.

The middle lid 3 is a cylindrical member having a shallow bottom, its outer diameter has approximately the same diameter as the opening 4 of the body 1, and a flange 7 is formed on its upper portion. The middle lid 3 seals the opening 4 by fitting of the flange 7 to the opening 4 of the body 1.

Next, a simple explanation will be given of the state in which solder balls are placed into the existing container.

Figure 2:
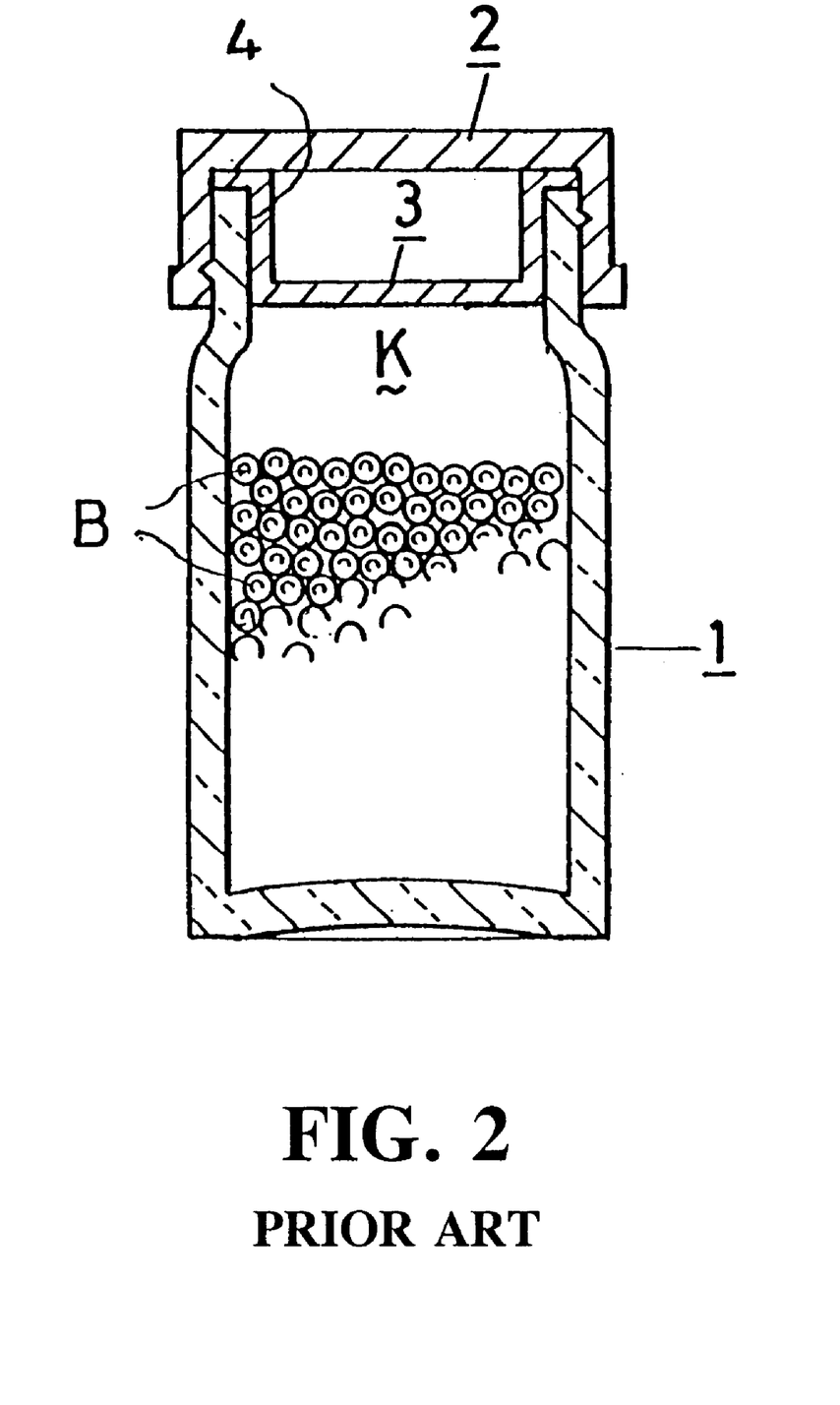
FIG. 2 is a cross-sectional view showing the state in which solder balls are packed into the existing solder ball container.

As shown in FIG. 2, a prescribed amount of solder balls B (referred to below simply as balls) is placed into the body 1 of the container, the opening 4 is tightly sealed by the middle lid 3, and the opening 4 is sealed by the outer lid 2. At this time, a large gap K develops between the balls B and the lower surface of the middle lid 3. The reason why a container on the large size in which such a large gap can develop is used is so to be able to cope with increases or decreases in the volume of the balls. Namely, if the container is made on the large size, even if the overall volume of the balls is somewhat large, there is ample space and the balls can be accommodated. For example, balls with a diameter of 0.76 mm generally have a tolerance of ±0.02 mm. When a large number of balls of a large diameter on the + side of this tolerance is placed into a container, the overall volume of the balls increases. The volume of the balls themselves increases according to the cube of the increase in the diameter of the balls, so with a container without a gap, when a prescribed amount of balls of prescribed dimensions is placed into it, in the case in which there are a large number of large balls, the prescribed number of balls ends up not fitting in.

However, when a large number of balls of prescribed dimensions or smaller than the prescribed dimensions are placed into a container on the large size of this type, a gap K such as shown in FIG. 2 ends up being formed.

SUMMARY OF THE INVENTION

When a ball manufacturer places solder balls into a container in which a large gap develops after balls are placed into it and ships it to a consumer, during shipping, the balls are shaken or made to tumble within the container and rub against the wall surface of the container. As a result, the surface of the balls ends up becoming black, and the solder balls end up being charged with static electricity. Blackening or electrical charging of the balls ends up causing soldering defects, dirtying of the vicinity of solder bumps, and problems such as failure of mounting to take place or excessive mounting of balls, as described above.

Due to the fact that blackening or electrical charging of balls in this manner is caused by a large gap within a container, means for getting rid of the gap have been conceived. One means is to fill a gap which forms in a container with a packing. As a packing for preventing movement of balls, it has been proposed to crumple up sheets of paper or polyethylene or the like and to cram them into the gap. However, with a packing made from crumpled sheet material, balls ends up penetrating into gaps in the crumpled material, and when the packing is removed, balls fly out therewith and end up being scattered in the periphery.

Figure 3:
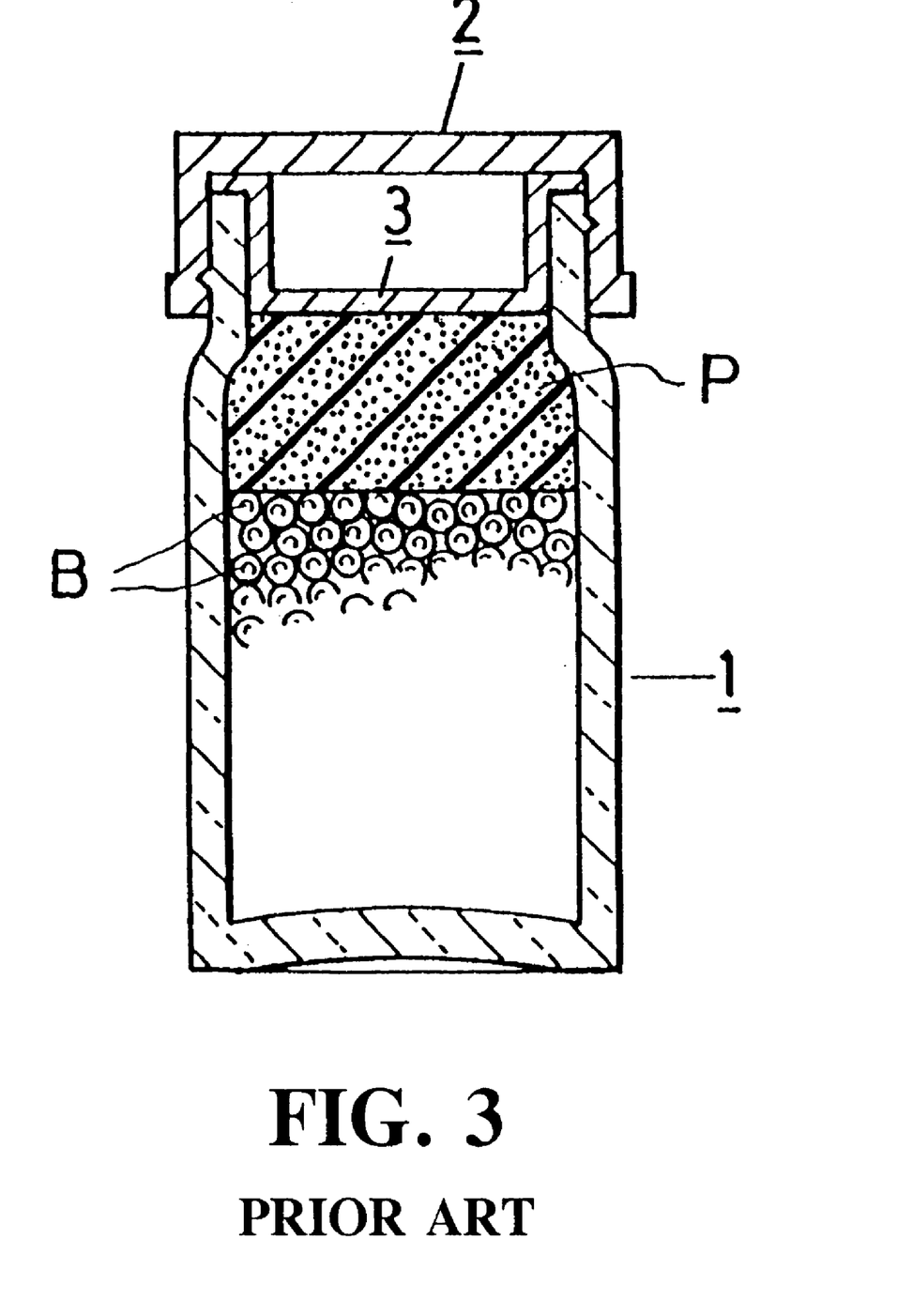
FIG. 3 is a cross-sectional view showing the state in which solder balls are packed into another existing solder ball container.

As shown in FIG. 3, it has been conceived of packing with a packing P made of sponge. However, if the balls are pressed until the sponge packing gets rid of a gap, the solder balls continuously receive the elastic reaction from the packing, and with the passage of a prolonged period of time, soft balls made of tin or lead end up being deformed, and at the time of solder bump formation, they cannot be accurately mounted by a ball mounting apparatus, resulting in failure of mounting to take place.

The object of this invention is to provide a solder ball container which prevents blackening and charging with electricity and does not produce deformation during transport of solder balls which fill the container.

The blackening and charging with static electricity of balls is due to balls being shaken and tumbled during transport and rubbing against the wall surface of a container as described above. Namely, the blackening of balls is caused by the surface of the balls being scraped when the balls rub against the wall surface of the container, and fine solder powder falls from the surfaces of the balls. Solder powder has a large surface area, so it is easily oxidized and blackened, and it adheres to balls, or it adheres to the vicinity of solder bumps after soldering, and it produces an unsightly blemish. As for charging of balls with static electricity, balls which tumble within the container during transport rub the wall surface of the container and static electricity is generated, so the balls end up being charged.

The present inventors perceived that if balls which are placed in a container are not vibrated by a large amount or made to tumble during transport, blackening or electrical charging of balls can be prevented, and thereby created the present invention.

The present invention is a solder ball container in which the opening of a cylindrical body with a bottom is sealed by an outer lid, characterized in that a projection having a shape which will not deform solder balls when it is inserted into a plurality of solder balls packed into the container is installed in the opening of the container.

BRIEF DESCRIPTION OF THE DRAWINGS

FIG. 5(1), FIG. 5(2), and FIG. 5(3) are cross-sectional views of various types of projections used in a solder ball container according to the present invention.

DESCRIPTION OF THE PREFERRED EMBODIMENTS

Figure 4:
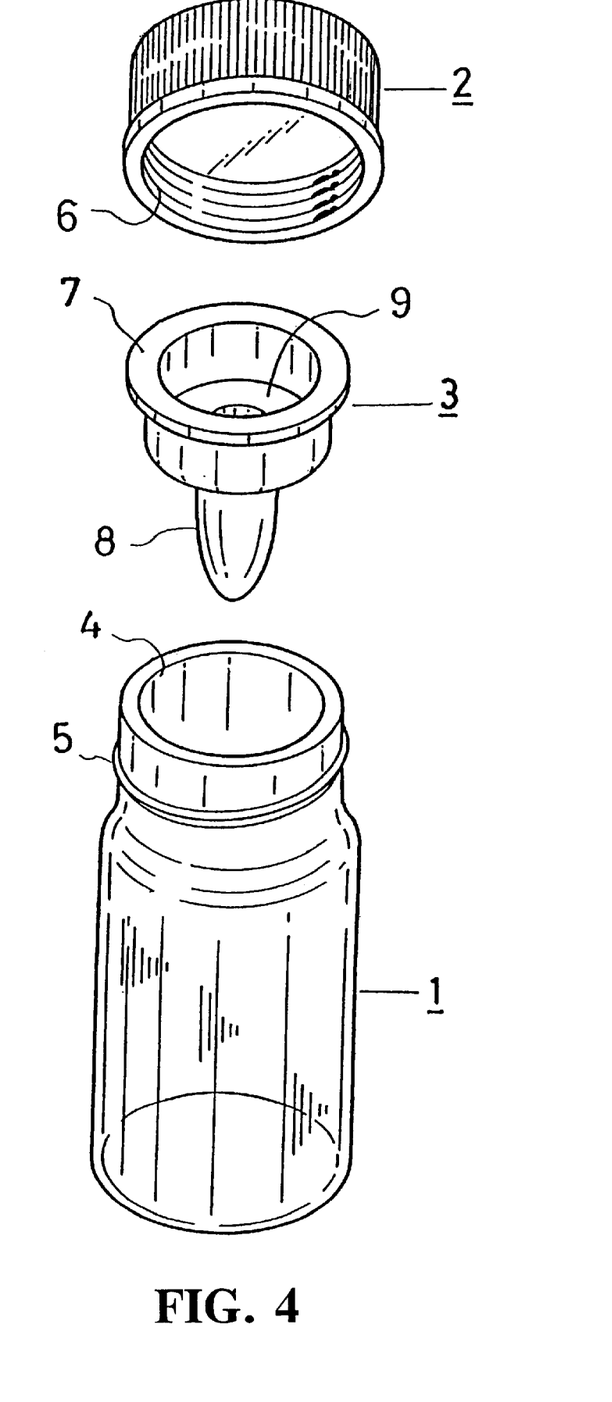
FIG. 4 is an exploded perspective view of a solder ball container according to the present invention.
Figure 5:
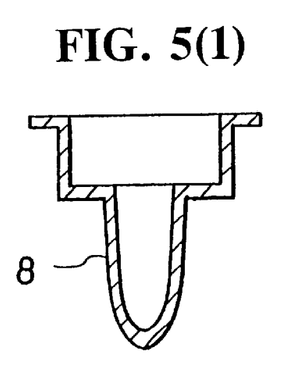

As shown in the exploded perspective view of FIG. 4, a solder ball container according to the present invention is composed of a body 1 which is made from a cylindrical member which has a bottom and which is made of a transparent material such as glass or plastic, an outer lid 2, and a middle lid 3. An opening 4 is formed in the upper portion, and a male thread 5 is formed on the outside of the upper portion. The outer lid 2 is in the shape of a cap, and a female thread 6, which threadingly engages with the male thread 5 of the body 1 is formed on the inside thereof.

According to the present invention, the middle lid 3 is formed from a cylindrical body having a shallow bottom, a projection 8 is provided on the bottom portion, the outer diameter has approximately the same diameter as the opening 4 of the body 1, and a flange 7 is formed on the upper portion. The middle lid 3 is arranged so as to seal the opening 4 when the flange 7 is fit on the opening 4 of the body 1.

A projection 8 used in a solder ball container according to the present invention has a shape such that even if its tip is inserted into a packed layer of balls within the container, it will not deform the balls by compressing them. For example, the cross section of the projection 8 can have a streamlined shape as shown in FIG. 4 or FIG. 5(1), the cross section can have an inverted conical shape as shown in FIG. 5(2), or it can be a cylindrical member with a tip having a semi-spherical shape as shown in FIG. 5(3) or having an unillustrated inverted conical shape.

If the projection is inserted into a packed layer of balls in a container in which balls are packed such that a gap can be formed, the projection will push balls out of the way and the balls will rise to decrease the gap. Therefore, the movement of balls within the container will decrease and blackening and charging with electricity will be prevented. Furthermore, if the projection is inserted into a packed layer of balls within the container, even if somewhat of a gap remains and the balls try to move during transport, the projection will prevent the balls from moving.

Namely, a container according to the present invention is arranged such that the projection 8 decreases the gap K and at the same time prevents the balls from moving, whereby blackening and electrical charging of balls is prevented.

If a projection used in the present invention is made such that its projecting length can be adjusted (arrow A) as shown in FIG. 5(3), the projection 8 can be moved in accordance with changes in the volume of balls in the container, and the gap K can be made as small as possible.

In the illustrated example, the projection is mounted on the middle lid, but it may also be directly mounted on the upper lid. In this case, the middle lid may be omitted.

Namely, a container according to the present invention can be one in which a projection is formed on the middle lid, and the outer lid and the projection are formed separately from each other, or it can be one in which the outer lid and the projection are completely integral with each other, or it can be one in which the outer lid and the projection are fitted together to form a single body.

Figure 6:
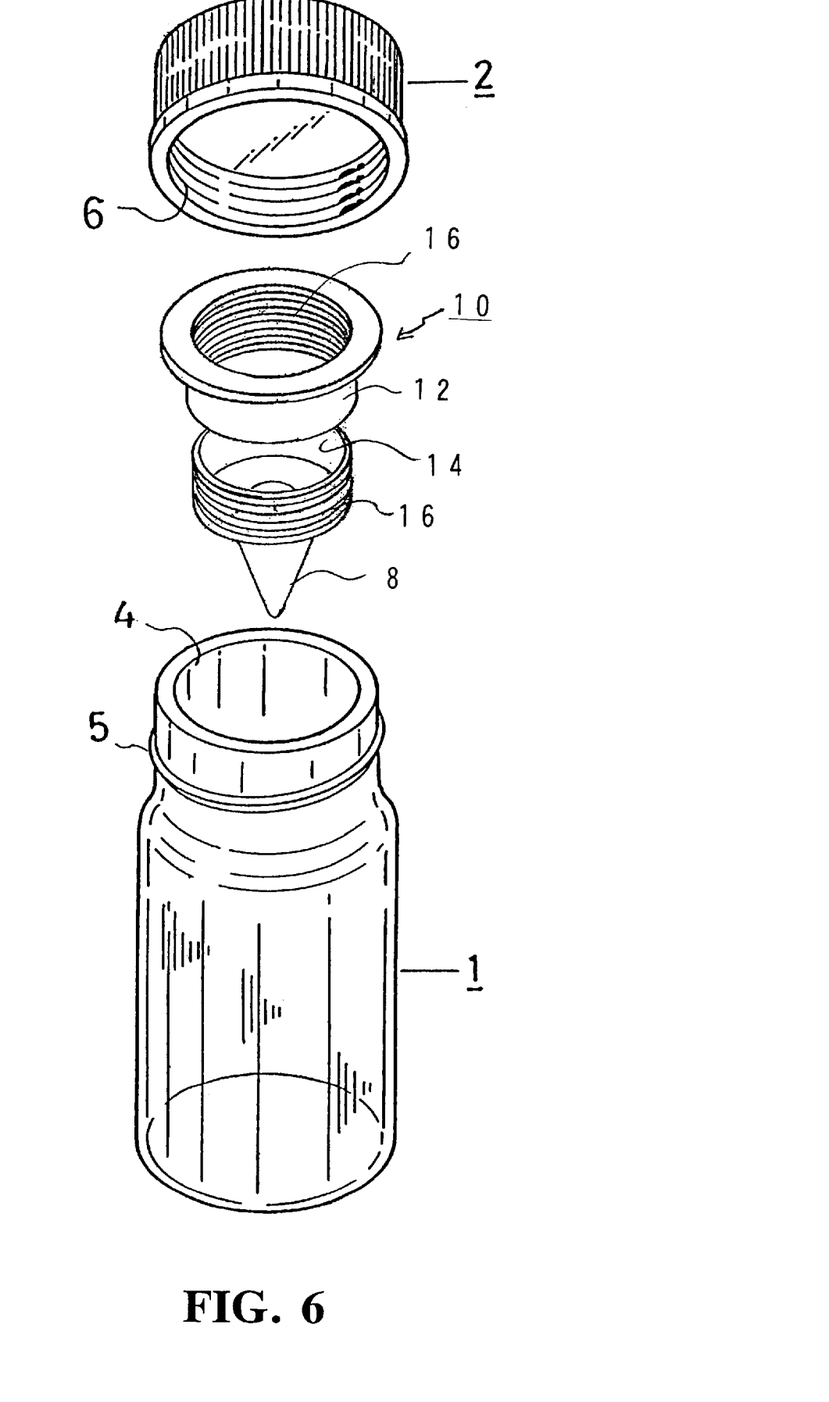
FIG. 6 is an exploded perspective view showing another mode of a solder ball container according to the present invention.

FIG. 6 is an exploded perspective view showing still another mode of the solder ball container according to the present invention shown in FIG. 5(3). In this figure, the same symbols as in FIG. 4 indicate the same components. In the illustrated example, the middle lid 10 comprises a cylindrical body 12 having a flange, and a sliding body 14 which fits therewith and which has a projection 8 on its bottom portion. Shallow annular grooves 16 are provided on the sliding surfaces of the cylindrical body 12 and the sliding body 14. They can slide with respect to each other and be maintained in a desired position. Instead of being provided with annular grooves 16, the surfaces of the sliding surfaces can be simply roughened to enable sliding and retaining.

EXAMPLES

Next, the operation and effects of the container according to the present invention shown in FIG. 4 will be described more specifically.

The embodiment shown in FIG. 4 has a projection formed on the middle lid, and the projection 8 is formed so that it projects downward from the bottom portion 9 of the middle lid 3. The projection has a streamlined shape, and its tip is rounded. An appropriate size for the projection is such that when it is inserted into balls in the container, a gap of approximately 3 to 8% of the volume of the body can be formed in the upper portion of the body. Namely, the size of the projection is such that when the projection is inserted into balls within the container, a small gap remains within the upper portion.

Figure 7:
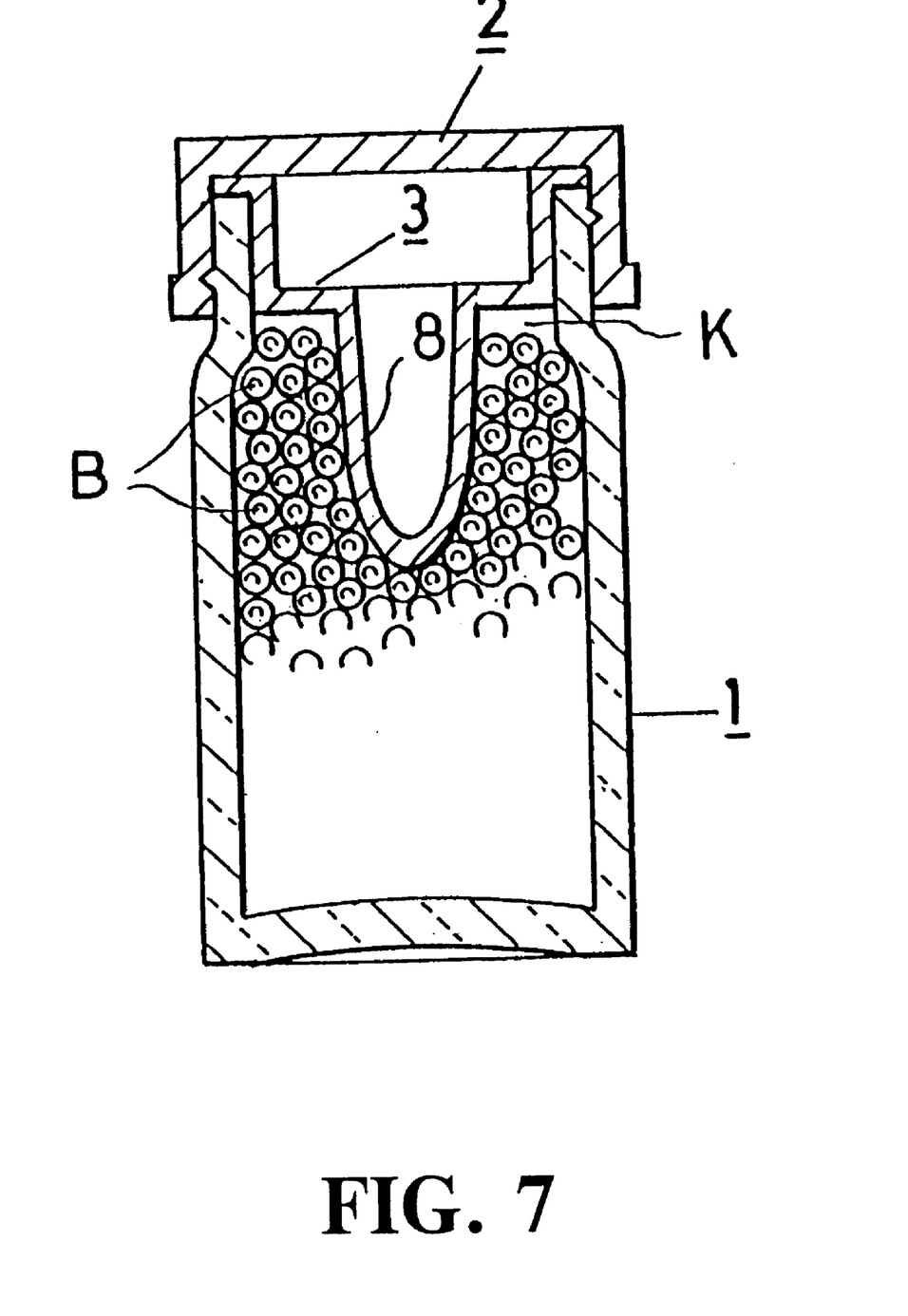
FIG. 7 is a cross-sectional view showing the state in which solder balls are packed into a solder ball container according to the present invention.

Next, the condition will be described in which balls are packed into a container according to the present invention and the projection is inserted into the balls. First, a prescribed quantity of balls B is placed into the body 1. The volume of the body is a little large so that a gap will be formed in the upper portion at this time when a prescribed amount of balls having prescribed dimensions are placed into it. When the balls B are inserted and the middle lid 3 is fitted on the opening 4 of the body 1 in the upper portion of which a gap is formed such that the flange 7 seals the upper portion of the opening, the projection 8 penetrates into the balls B packed in the body 1 as shown in FIG. 7. The balls which are pushed out of the way by the penetration of the projection 8 rise up and the gap K becomes small. Then, the outer lid 2 is screwed onto the male thread 5 of the opening to perform sealing.

In the mode shown in FIG. 5(3) and FIG. 6, if the projection 8 is further penetrated into the interior after the middle lid is fit onto the opening 4, it is possible to make the size of the gap K at this time as small as possible.

A blackening test was carried out on balls in a container according to the present invention and an existing container. The containers had a volume of 100 cc, and 250,000 balls measuring 0.76 mm±0.01 mm were placed therein. The projection used in the container according to the present invention had a streamlined shape like that shown in FIG. 4 and was formed on the middle lid, and it had a volume of approximately 7 cc.

The existing container was one with a middle lid of cylindrical shape with a shallow bottom, as shown in FIG. 1.

The containers packed with balls were placed in a rotating machine and were rotated at 150 rotations per minute. As a result, the balls in the existing container began to blacken at 20 minutes, and at 30 minutes they ended up being completely blackened. When the blackened balls were thereafter removed from the container, some of the balls were seen adhering to each other.

On the other hand, blackening of the balls in the container according to the present invention did not take place even after 30 minutes had elapsed, and there was no adhesion of the balls to each other when they were removed from the container.

As described above, a container according to the present invention has a projection installed in the opening of a body, and the projection will not deform balls when it is inserted into a large number of balls, so balls which are packed within the body can be raised without imparting any deformation at all to the balls and a gap can be made small, whereby not only can movement of the balls be decreased, but the movement of the balls can be further prevented by insertion of the projection into the balls, so that even if balls packed in the container are subjected to vibration or shaking during transport, the balls do not undergo blackening or electrical charging, thereby providing an excellent effect not existing in the past.

What is claimed is:

1. A solder ball container comprising a hollow body containing solder balls and having an opening and a bottom, a lid disposed at the opening, and a projection inserted into the body through the opening into the solder balls, the projection having a shape which does not deform the solder balls.

2. A solder ball container as claimed in claim 1, wherein the projection has a streamlined cross section.

3. A solder ball container as claimed in claim 1, wherein the projection has a cross section with an inverted conical shape.

4. A solder ball container as claimed in claim 1, wherein the projection comprises a cylinder with a tip having a semi-spherical or inverted conical shape.

5. A solder ball container as claimed in claim 1, wherein a length by which the projection can be inserted into the solder balls is adjustable.

6. A solder ball container as claimed in claim 1, wherein the projection is integral with the lid.

7. A solder ball container as claimed in claim 1, wherein a gap of approximately 3 to 8% of the volume of the body is present in an upper portion of the container above the solder balls.

8. A solder ball container comprising a hollow body containing solder balls and having an opening and a bottom, a middle lid and an outer lid disposed at the opening, and a projection mounted on the middle lid and inserted into the solder balls, the projection having a shape which does not deform the solder balls.

9. A solder ball container as claimed in claim 8, wherein the projection is formed separately from the middle lid and a length by which the projection can be inserted into the solder balls is adjustable.

10. A solder ball container as claimed in claim 8, wherein the projection is integral with the middle lid.

11. A solder ball container as claimed in claim 8, wherein the projection has a streamlined cross section.

12. A solder ball container as claimed in claim 8, wherein the projection has a cross section with an inverted conical shape.

13. A solder ball container as claimed in claim 8, wherein the projection comprises a cylinder with a tip having a semi-spherical or inverted conical shape.

14. A solder ball container as claimed in claim 8, wherein a gap of approximately 3 to 8% of the volume of the body is present in an upper portion of the container above the solder balls.

15. A method of housing solder balls in a container comprising disposing solder balls in a container, inserting a projection into the solder balls to displace a portion of the solder balls without deforming the solder balls and decrease a gap in an upper portion of the container above the solder balls, and closing the container.

16. A method as claimed in claim 15, wherein the projection has a streamlined cross section.

17. A method as claimed in claim 15, wherein the projection has a cross section with an inverted conical shape.

18. A method as claimed in claim 15, wherein the projection comprises a cylinder with a tip having a semispherical or inverted conical shape.

19. A method as claimed in claim 15, including adjusting a length by which the projection is inserted into the solder balls.

20. A method as claimed in claim 15, including closing the container with a lid connected to the projection.

21. A method as claimed in claim 15, wherein a gap of approximately 3 to 8% of the volume of a body of the container is present in an upper portion of the container above the solder balls after inserting the projection into the solder balls.

* * * * *